United States Patent

Yamamoto et al.

[11] Patent Number: 5,311,038
[45] Date of Patent: May 10, 1994

[54] PHOTOELECTRIC CONVERTER WITH ELECTRON INJECTION PREVENTIVE LAYER

[75] Inventors: Hidekazu Yamamoto; Yasutaka Nishioka, both of Hyogo, Japan

[73] Assignee: Mitsubishi Denki Kabushiki Kaisha, Tokyo, Japan

[21] Appl. No.: 63,948

[22] Filed: May 20, 1993

[30] Foreign Application Priority Data

Jul. 3, 1992 [JP] Japan .................................. 4-176842

[51] Int. Cl.⁵ .............................................. H01L 27/14
[52] U.S. Cl. ........................................ 257/40; 257/59; 257/444; 257/435; 257/438; 136/258
[58] Field of Search ................... 257/59, 222, 444, 40, 257/435, 438, 186; 136/258

[56] References Cited

U.S. PATENT DOCUMENTS 4,551,405  7/1984  Nakagawa et al. .................. 430/64
4,877,709  10/1989  Inoue et al. ......................... 430/128

FOREIGN PATENT DOCUMENTS 57-178245  11/1982  Japan .
62-78576  4/1987  Japan .

OTHER PUBLICATIONS

Miyagawa et al, "A New, Pre-Discharge Boron Doping Method For Amorphous Silicon Photoconversion Layer in HDTV Image Sensor", IEEE, IEDM, 1988, pp. 74–77.
Katayama et al, "The Characteristics Of Buried a-Si:H And a-SiC:H p-i-n Photodiode Sensor", ITE Annual Convention, 1988, pp. 17–18.
Tanioka et al, "Avalanche-Mode a-Se Photoconductive Target For High Sensitive Camera Tube", ITE, vol. 44, No. 8, 1990, pp. 1074–1083.
Yano et al, Proceedings Of National Conference Of Television Association, 1985, pp. 63–64 (No Title Available).
Hatanaka et al, Electronic Information Communication Society Technical Report, 1987, pp. 19–23, "Energy-- Band Discontinuities in a Heterojunction of A-SixNy/c-Si".

*Primary Examiner*—William Mintel
*Attorney, Agent, or Firm*—Leydig, Voit & Mayer

[57] ABSTRACT

An improved photoelectric converter with reduced dark current includes a first electrode on a substrate covered by a semiconductor layer for photoelectric conversion. A second electrode is disposed on the semiconductor layer. An electron injection preventive layer is inserted between the semiconductor layer and the second electrode for preventing electrons from being injected from the second electrode into the semiconductor layer. The electron injection preventive layer is formed of a material satisfying the inequality:

$$\phi_M - x_2 \geq E_{g1}$$

where the work function of the second electrode is $\phi_M$, the electron affinity of the electron injection preventive layer is $x_2$, and the band gap energy of the semiconductor layer is $E_{g1}$.

15 Claims, 6 Drawing Sheets

● ELECTRON
○ HOLE $$\left(0 < \frac{n}{m+n} \leqq 1\right)$$

FIG. 9
PRIOR ART
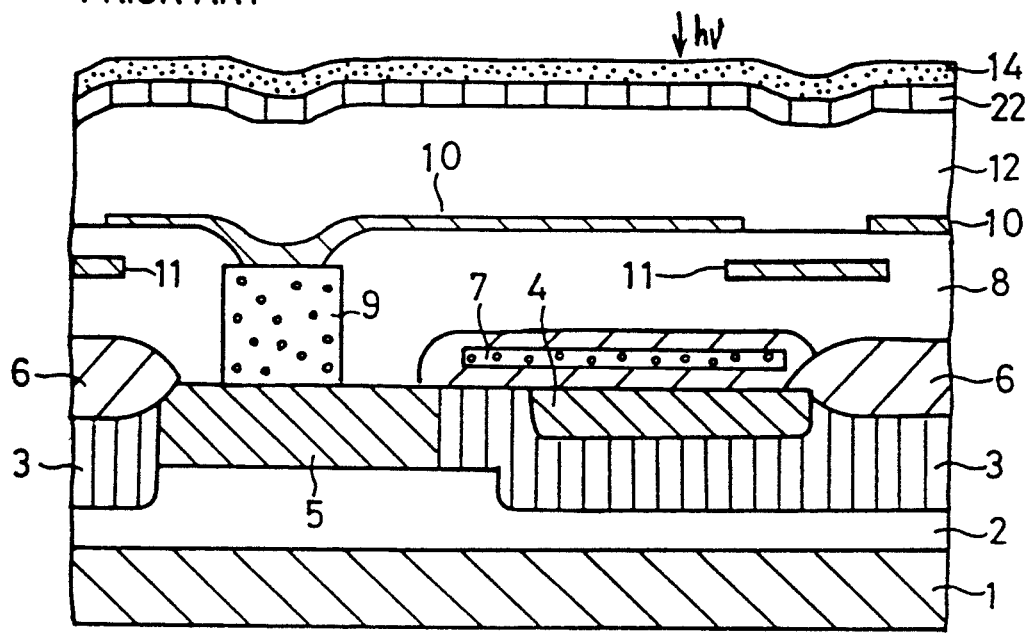
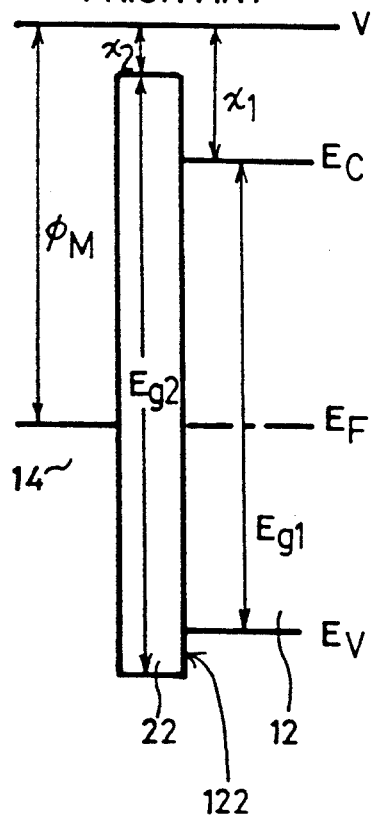
FIG. 10(a)
PRIOR ART
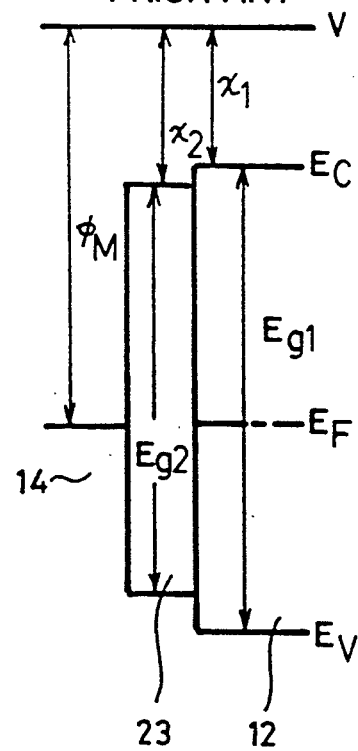
FIG. 10(b)
PRIOR ART
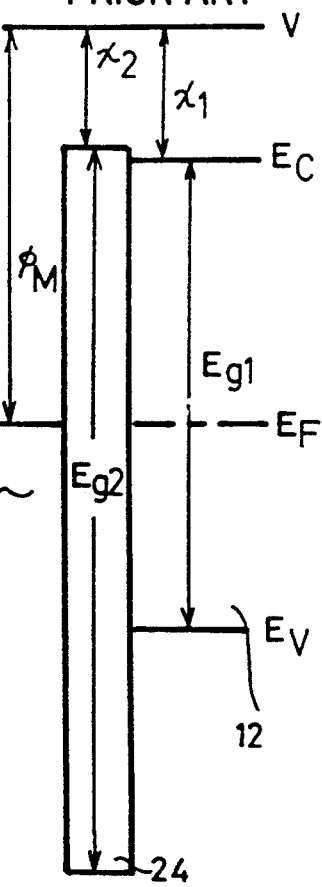
FIG. 10(c)
PRIOR ART

● ELECTRON
○ HOLE

PHOTOELECTRIC CONVERTER WITH ELECTRON INJECTION PREVENTIVE LAYER

FIELD OF THE INVENTION

The invention relates generally to photoelectric converters, and more specifically, to an improved photoelectric converter with reduced dark current.

DESCRIPTION OF THE BACKGROUND ART

FIG. 9 is a cross sectional view showing a conventional stacked type solid state image sensing apparatus as disclosed, for example, in Proceedings of National Conference of Television Association by Yano et al., 1985 p.63.

Referring to FIG. 9, a p type semiconductor layer 2 is provided on an n type semiconductor substrate 1. Provided on the p type semiconductor layer 2 are a p type semiconductor layer 3 in which a charge transfer portion is to be produced, and an n type semiconductor layer 5 for forming a signal charge storage portion. An n type semiconductor layer 4 forming a buried channel for charge transfer is disposed on a main surface of the p type semiconductor layer 3. A silicon oxide film 6 is provided on a main surface of the p type semiconductor layer 3. A polysilicon gate electrode 7 for reading and transferring charge is provided on the n type semiconductor layer 4 with the silicon oxide film 6 therebetween. A polysilicon layer 9 which is a part of an interconnection between a photoelectric conversion portion and the charge storage portion is connected to the n type semiconductor layer 5. An insulating layer 8 is provided on the n type semiconductor substrate 1 covering the silicon oxide film 6 and the polysilicon layer 9. A metal layer 11 for shielding light is provided in the insulating layer 8. An interconnection metal 10 that is separate for every pixel is disposed on the insulating layer 8. A photoelectric conversion film 12 formed of intrinsic amorphous silicon or the like is disposed on the n type semiconductor layer 1 so as to cover the interconnection metal 10. Provided on the photoelectric conversion film 12 is an electron injection preventive layer 22 formed of p type amorphous silicon carbide or the like. A transparent electrode 14 is provided on the electron injection preventive layer 22.

Now, an operation will be described.

With a negative voltage being applied to the transparent electrode 14, light is incident on the photoelectric conversion film 12. Among charges generated in the photoelectric conversion film 12, electrons move toward the interconnection metal 10 because of an electric field in the photoelectric conversion film 12 and are stored in the n type semiconductor layer 5. The stored charges move to the n type semiconductor layer 4 upon application of a large positive voltage to the gate electrode 7. The signal charges are transferred in one direction by the function of a vertical charge transfer element formed in the n type semiconductor layer 4, and then externally read out through a horizontal charge transfer element which is not shown.

A conventional stacked type solid state image sensing apparatus utilizing amorphous silicon carbide which is the most generally used for an electron injection preventive layer has the following problem.

FIG. 10 (a) is a representation showing an energy band in the vicinity of the interface between a photoelectric conversion film and an electron injection preventive layer when amorphous silicon carbide is utilized for the electron injection preventive layer. This figure is disclosed by Katayama et al. in Proceedings of National Conference of Television Society, 1991, p.17. In the figure, reference numeral 14 represents a transparent electrode, 22 an electron injection preventive layer, and 12 a photoelectric conversion film, while $E_C$ represents energy at the conduction band edge, $E_V$ energy at the valence band edge, and $E_F$ a Fermi level. V represents a vacuum level, $\phi_M$ a work function for the transparent electrode 14, $x_2$ the electron affinity of amorphous silicon carbide (22), $Eg_2$ the band gap of amorphous silicon carbide (22), $x_1$ the electron affinity of the photoelectric conversion film 12, and $Eg_1$ the band gap of the photoelectric conversion film 12.

As can be seen from FIG. 10 (a), when amorphous silicon carbide is used for the electron injection preventive layer, since $\phi_M - x_2$ is small (judged from a value relative to $Eg_1$), in other words, its energy barrier is small, dark current cannot be prevented effectively.

A detailed description will be provided of generation of dark current in conjunction with FIG. 11. FIG. 11 shows an energy band when light irradiates a solid state image sensing apparatus having an energy band shown in FIG. 10 (a). In the figure, A represents a dark current component (electrons) thermally generated from the electrode 14 and injected into the photoelectric conversion film 12. B is a dark current component thermally generated in the photoelectric conversion film 12. C is a signal charge when light is incident inside the photoelectric conversion film 12. In the figure, an empty circle represents a hole, and a solid circle represents an electron. S/N ratio is generally given by the following equation:

$$S/N \; ratio = C/(A+B)$$

Since B is a fixed value, A should be reduced in order to increase the value of S/N. In the solid state image sensing apparatus having an energy band illustrated in FIG. 10 (a), since $\phi_M - x_2$ is small (its energy barrier is small), electrons (dark current) thermally generated from the transparent electrode 14 and coming into the photoelectric conversion film 12 cannot be prevented effectively. Consequently, the value of A is increased, resulting in a small S/N ratio.

Further, since $x_2 + Eg_2$ is larger than $x_1 + Eg_1$, an energy barrier 122 is generated, resulting in the accumulation of holes between the photoelectric conversion film 12 and the electron injection preventive layers 22.

As a result, the electrons and the holes recombine, the potential of the photoelectric conversion film 12 changes, degrading the performance of the apparatus.

FIG. 10 (b) is another conventional example, and shows an energy band of the target of an image sensing tube utilizing antimony trisulfide ($Sb_2S_3$) for an electron injection preventive layer 23 in the vicinity of the interface between the photoelectric conversion film 12 and the electron injection preventive layer 23. This energy band representation is disclosed by Tanioka et al. in Television Society Papers, Vol. 44, No. 8 (1990) p. 1074. Also in this conventional example, as can be seen from FIG. 10 (b), dark current cannot be prevented because $\phi_M - x_2$ is small.

FIG. 10 (c) is an energy band representation in the vicinity of the interface between the photoelectric conversion film 12 and an injection preventive layer 24 when an amorphous silicon nitride film is used for the electron injection preventive layer 24. The energy band representation given in FIG. 10 (c) is disclosed by Hatanaka et al. in Electronic Information Communication Society Technical Report SDM87-15 (1987), p. 19. As can be clearly seen from the figure, dark current cannot be prevented because the value of $\phi_M - x_2$ is small. Furthermore, according to this conventional example, holes are accumulated in the interface between the photoelectric conversion film 24 and the electron injection preventive layer 12.

It is therefore an object of the invention to provide an improved photoelectric converter with reduced dark current.

Another object of the invention is to provide an improved photoelectric converter preventing holes from being accumulated between a photoelectric conversion film and an electron injection preventive layer.

A further object of the invention is to provide an improved solid state image sensing apparatus with reduced dark current.

Yet another object of the invention is to provide an improved image sensing tube target with reduced dark current.

A still further object of the invention is to provide an improved solar battery with reduced dark current.

A still further object of the invention is to provide an improved avalanche photodiode with reduced dark current.

In order to achieve the above-stated objects, a photoelectric converter in accordance with the invention includes a substrate, a first electrode on the substrate, and a semiconductor on the substrate covering the first electrode for photoelectric conversion. A second electrode is on the semiconductor. An electron injection preventive layer for preventing electrons from being injected from the second electrode to the semiconductor is inserted between the semiconductor and the second electrode. The electron injection preventive layer is formed of a material satisfying the following inequality, where the work function of the second electrode is $\phi_M$, the electron affinity of the electron injection preventive layer is $x_2$, and the band gap of the semiconductor is $Eg_1$:

$$\phi_M - x_2 \geq Eg_1$$

In a photoelectric converter in accordance with another aspect of the invention, an electron injection preventive layer is formed of a material further satisfying the following inequality, where the electron affinity of the electron injection preventive layer is $x_2$, and the electron affinity of the semiconductor is $x_1$:

$$x_2 \leq x_1$$

In a photoelectric converter in accordance with another aspect of the invention, an electron injection preventive layer is formed of a material further satisfying the following inequality, where the band gap of the electron injection preventive layer is $Eg_2$, the electron affinity of the semiconductor is $x_1$, and the band gap of the semiconductor is $Eg_1$:

$$x_2 + Eg_2 \leq x_1 + Eg_1$$

A photoelectric converter in accordance with yet another aspect of the invention is directed to a solid state image sensing apparatus including the above-stated properties.

A photoelectric converter in accordance with a still further aspect of the invention is directed to an image sensing tube target including the above-stated properties.

A photoelectric converter in accordance with a yet another aspect of the invention is directed to a solar battery including the above-stated properties.

A photoelectric converter in accordance with a still further aspect of the invention is directed to an avalanche photodiode including the above-stated properties.

In a photoelectric converter according to the invention, since an electron injection preventive layer is formed of a material satisfying the following inequality where the work function of the second electrode is $\phi_M$, the electron affinity of the electron injection preventive layer is $x_2$, and the band gap of semiconductor is $E_1$, a dark current component thermally generated in the second electrode is interrupted by a high energy barrier and will not enter the photoelectric conversion film.

$$\phi_M - x_2 \geq Eg_1$$

In a photoelectric converter in accordance with another aspect of the invention, since the above-stated electron injection preventive layer is formed of a material further satisfying the following inequality, where the affinity of the electron injection preventive layer is $x_2$, and the electron affinity of the semiconductor is $x_1$, not only the dark current component can be prevented from entering the photoelectric conversion film from the second electrode, but also holes generated in the photoelectric conversion film will not be accumulated in the interface between the photoelectric conversion layer and the electron injection preventive layer.

$$x_2 \leq x_1$$

In a photoelectric converter in accordance with yet another aspect of the invention, since the above-stated electron injection preventive layer is formed of a material satisfying the following inequality where the electron affinity of the electron injection preventive layer is $x_2$, the band gap of the electron injection preventive layer is $Eg_2$, the electron affinity of the semiconductor is $x_1$, and the band gap of the semiconductor is $Eg_1$, holes will not be accumulated in the interface between the photoelectric conversion layer and the electron injection preventive layer.

$$x_2 + Eg_2 \geq x_1 + Eg_1$$

In a photoelectric converter in accordance with yet another aspect of the invention, a photoelectric converter having the above-stated properties is applied to a solid state image sensing apparatus, so that an improved solid state image sensing apparatus with reduced dark current can be provided.

In a photoelectric converter in accordance with a still further aspect of the invention, since a photoelectric converter having the above-stated properties is applied to an image sensing tube target, an image sensing tube target with reduced dark current can be provided.

In a photoelectric converter in accordance with yet another aspect of the invention, since a photoelectric converter having the above-stated properties is applied to a solar battery, an improved solar battery with reduced dark current can be provided.

In a photoelectric converter in accordance with a still further aspect of the invention, since the above-stated photoelectric converter is applied to an avalanche photodiode, an avalanche photodiode with reduced dark current can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a cross sectional view showing a conventional solid state image sensing apparatus;

FIGS. 10(a), 10(b), and 10(c) are representations showing the energy band of a conventional photoelectric converter in the vicinity of the interface between a photoelectric conversion film and an electron injection preventive layer.

DESCRIPTION OF THE PREFERRED EMBODIMENTS

Figure 1:
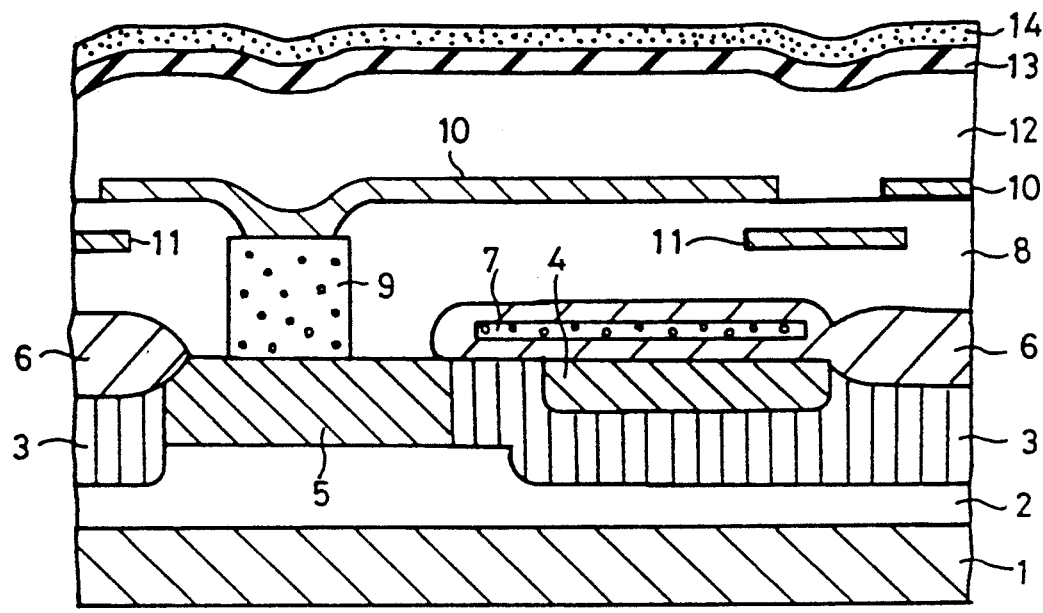
FIG. 1 is a cross sectional view showing a solid state image sensing apparatus in accordance with one embodiment of the invention.

FIG. 1 is a cross sectional view showing a solid state image sensing apparatus in accordance with a first embodiment of the invention. The solid state image sensing apparatus shown in FIG. 1 is substantially identical to the conventional solid state image sensing apparatus shown in FIG. 9 except for the following differences. The same elements are denoted with the same reference numerals, and the description thereof will not be repeated here. A major difference between the solid state image sensing apparatus shown in FIG. 1 and the conventional solid state image sensing apparatus shown in FIG. 9 is the use of chrysene as the electron injection preventive layer 13. The electron injection preventing layer 13 of chrysene is formed by a method of evaporating chrysene on a substrate, or dissolving chrysene in a solvent, applying the solution to the substrate, and then evaporating the solvent.

Figure 2:
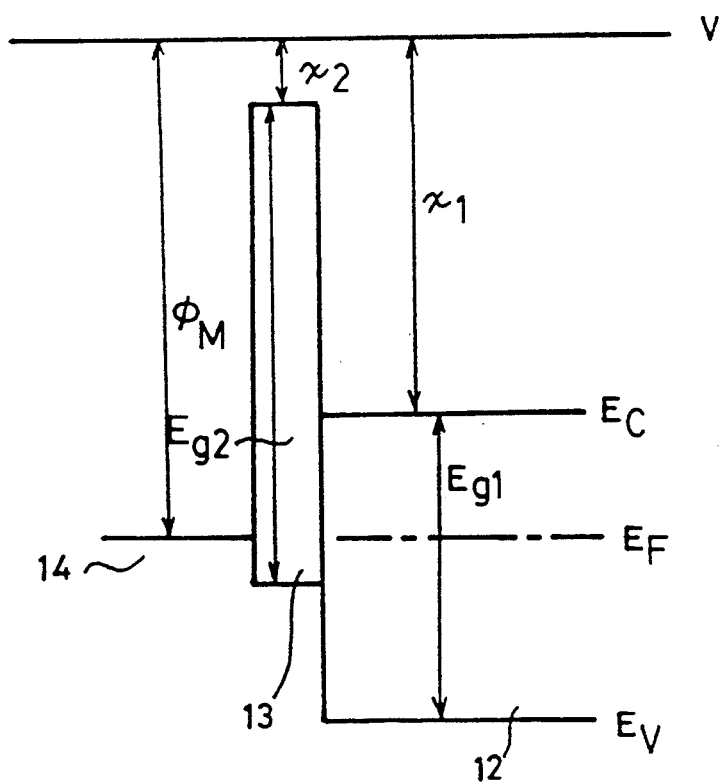
FIG. 2 is a representation showing the energy band of the solid state image sensing apparatus shown in FIG. 1 in the vicinity of the interface between a photoelectric conversion film and an electron injection preventive layer.

FIG. 2 is a representation showing an energy band in the vicinity of the interface between the photoelectric conversion film 12 and the electron injection preventive layer 13 when chrysene is used for the electron injection preventive layer 13. In the figure, reference numeral 14 represents a transparent electrode, 13 the electron injection preventive layer formed of chrysene, and 12 the photoelectric conversion film formed of intrinsic amorphous silicon. Also in the figure, $\phi_M$ represents the work function of the transparent electrode 14, $x_2$ the electron affinity of the electron injection preventive layer 13, $Eg_2$ the band gap of the electron injection preventive layer 13 utilizing chrysene, $x_1$ the electron affinity of the photoelectric conversion film 12, and $Eg_1$ the band gap of the photoelectric conversion film 12. Furthermore, V represents a vacuum level, Ec energy at the bottom of a conduction band, $E_V$ energy at the top of a valence electron band, and $E_F$ a Fermi level.

Referring to FIG. 2, advantages when the electron injection preventive layer 13 is formed of chrysene will be described.

The electron affinity of chrysene ($x_2$) is 0.42 eV as disclosed in Manual of Chemistry Edited by Chemical Society of Japan, Vol. 2 (revised), Elementary Section II, p. 1287. The band gap of chrysene ($Eg_2$) is at least twice the activation energy of specific resistance and therefore can be estimated to be about 4.4 eV which is twice the value of the activation energy of specific resistance given in the above-stated manual (p. 1162).

The electron affinity ($x_1$) of amorphous silicon used for the photoelectric conversion film 12 is 4.05 eV as disclosed in Sze, Physics of Semiconductor Devices, Second Edition p. 850, with its band gap usually falling in the range from 1.6 to 1.8 eV.

The work function ($\phi_M$) of ITO and $SnO_2$ which are usually used for the transparent electrode 14 are both about 5 eV. The following inequalities are established from the aforementioned data:

$$\phi_M - x_2 \geq Eg_1 \tag{1}$$

$$x_2 \leq x_1 \tag{2}$$

$$x_2 + Eg_2 \leq x_1 + Eg_1 \tag{3}$$

Figure 3:
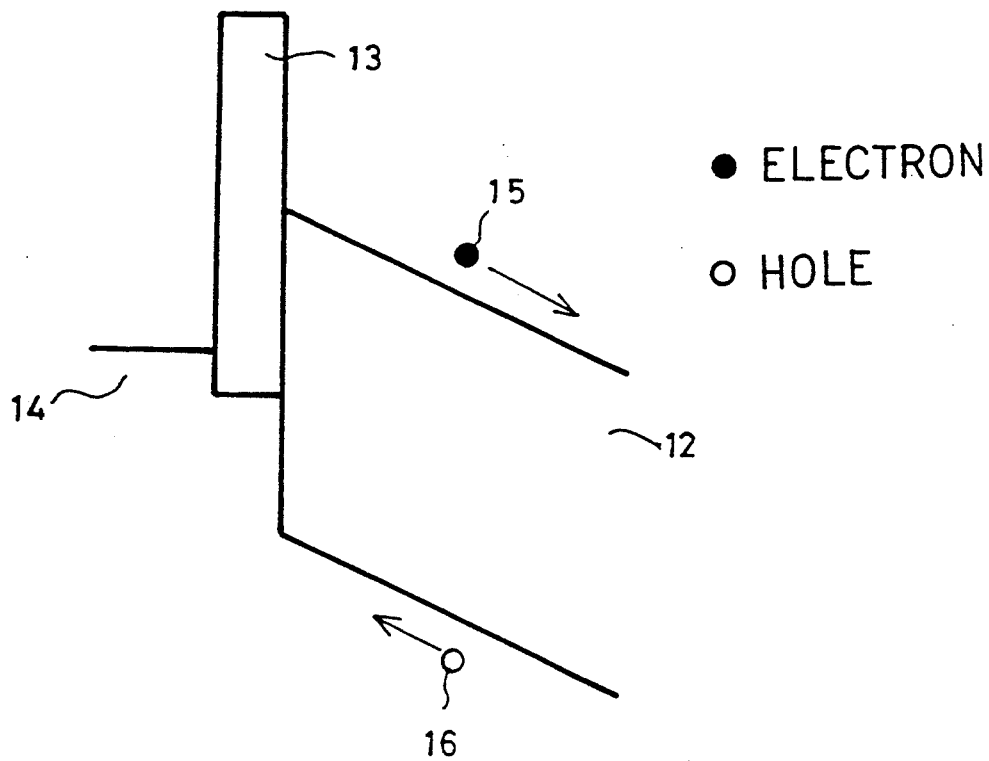
FIG. 3 is a representation showing the energy band of the solid state image sensing apparatus shown in FIG. 1 in operation in the vicinity of the interface between the photoelectric conversion film and the electron injection preventive layer.

FIG. 2 represents an energy band in the vicinity of the interface between the photoelectric conversion film 12 and the electron injection preventive layer 13 formed of chrysene when no voltage is applied. FIG. 3 represents the energy band edges during operation. Reference numeral 15 represents electrons generated in the photoelectric conversion film 12 when light is incident on the photoelectric conversion film 12, while reference numeral 16 represents holes.

The value of ($\phi_M - x_2$) is calculated to be 4.58 eV. Since the energy barrier is high, a dark current component (electrons) thermally generated in the transparent electrode 14 is shielded by this energy barrier and will not be injected into the photoelectric conversion film 12.

There is no energy barrier for holes in the valence band of the electron injection preventive layer 13, and, therefore, holes 16 will not be accumulated in the interface between the electron injection preventive layer 13 and the photoelectric conversion film 12. Consequently, a solid state image sensing apparatus with an excellent performance is provided which has a reduced dark current component and is free from change in the potential of the photoelectric conversion film 12.

Figure 4:
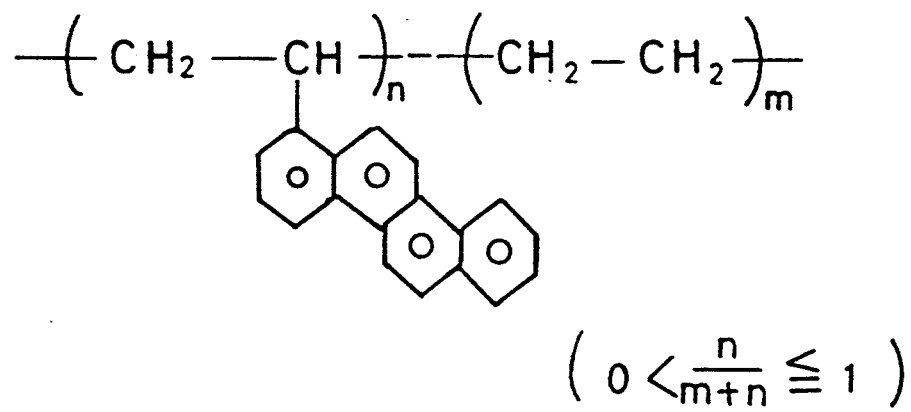
FIG. 4 is structural formula of a material for an electron injection preventing layer in accordance with the invention.

Although in the above-stated embodiment, chrysene is utilized to form the electron injection preventive layer 13, the invention is not limited thereto, and the same effects as this embodiment can be achieved utilizing an organic compound containing a condensed polycyclic hydrocarbon in its molecular structure such as anthracene and phenanthrene, or a polymer compound formed by binding chrysene as shown in FIG. 4, any of which satisfies the aforementioned inequalities (1), (2), and (3). Also in FIG. 4, an example of a polymer compound with chrysene bound to a side chain is illustrated, but the invention is not limited to this example, and any organic compound containing a condensed polycyclic hydrocarbon in its molecular structure can be utilized as a side chain. The polymer main chain does not have to be polyethylene as shown in the figure, and any substance forming a polymer may be used.

Figure 5:
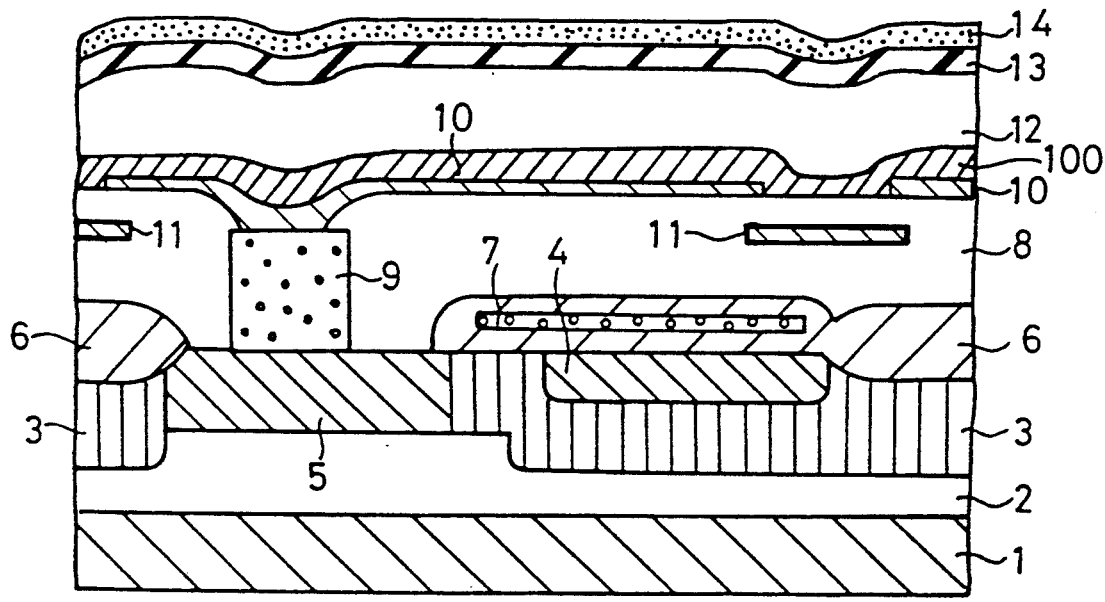
FIG. 5 is a cross sectional view showing a solid state image sensing apparatus in accordance with another embodiment of the invention.

A second embodiment shown in FIG. 5 is an improved version of the first embodiment shown in FIG. 1. A solid state image sensing apparatus shown in FIG. 5 is substantially identical to the embodiment shown in FIG. 1 except for the following essential difference, therefore the corresponding elements are given the same reference characters, and the description thereof will not be repeated here.

A major difference between the first embodiment shown in FIG. 1 and the second embodiment shown in FIG. 5 is that a hole injection preventive layer 100 for preventing holes from being injected into the photoelectric conversion film from the interconnection metal 10 is provided covering the interconnection metal 10 between the interconnection metal 10 and the photoelectric conversion film 12. A silicon nitride film is preferably utilized for the hole injection preventing layer 100. Injection of a dark current component from the interconnection metal 10 to the photoelectric conversion film 12 can effectively be prohibited by the provision of the hole injection preventive layer 100.

Figure 6:
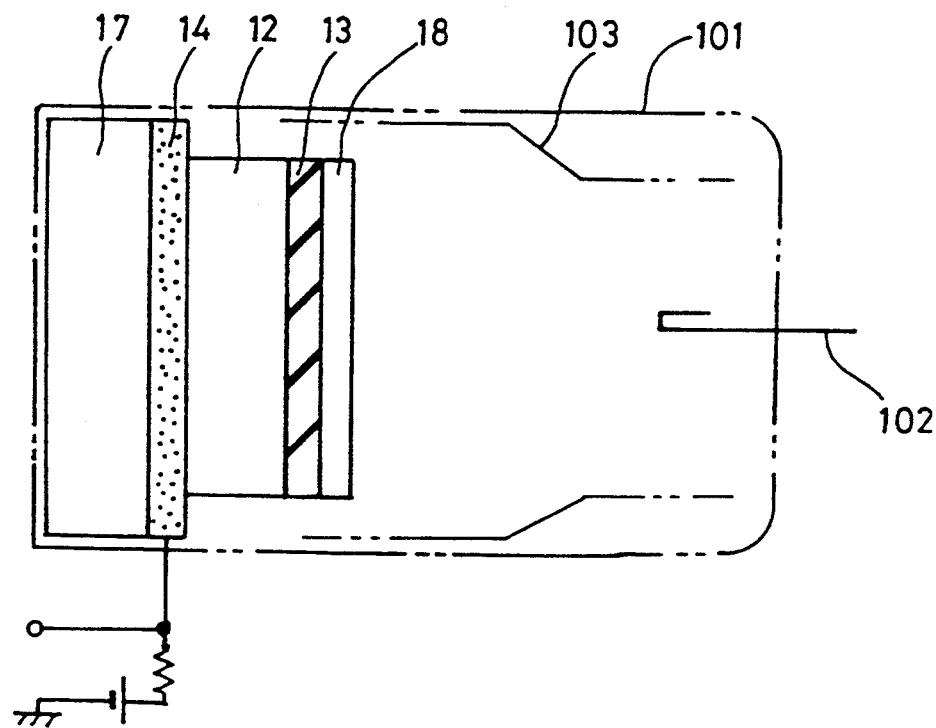
FIG. 6 is a cross sectional view showing an image sensing tube target to which the invention is applied.

FIG. 6 is a cross sectional view showing an image sensing tube target to which the invention is applied. A transparent electrode 14 is provided on a transparent substrate 17. A photoelectric conversion film 12 formed of intrinsic amorphous silicon is provided on the transparent electrode 14. An electron injection preventive layer 13 of, for example, chrysene satisfying the aforementioned inequalities (1), (2), and (3) is provided on the photoelectric conversion film 12. An electron sticking layer 18 is provided on the electron injection preventive layer 13. In the figure, reference numeral 101 represents a glass tube, reference numeral 102 a cathode for generating an electron beam, and reference numeral 103 an acceleration electrode for accelerating the electron beam.

Since the electron injection preventive layer 13 is formed of a material satisfying the aforementioned inequalities (1), (2), and (3), an image sensing tube target with reduced dark current is provided.

Figure 7:
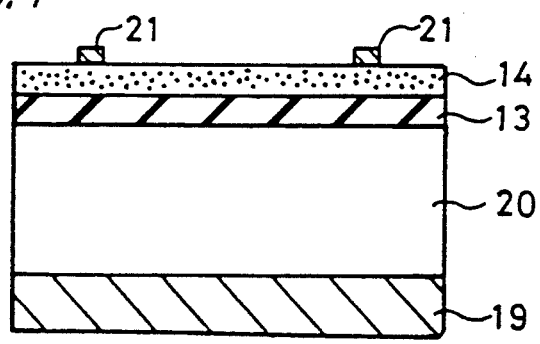
FIG. 7 is a cross sectional view showing a solar battery to which the invention is applied.

FIG. 7 is a cross sectional view showing a solar battery to which the invention is applied.

A photoelectric conversion layer 20 is provided on a substrate 19. An electron injection preventive layer 13 formed of a material such as chrysene satisfying the aforementioned inequalities (1), (2), and (3) is provided on the photoelectric conversion layer 20. A transparent electrode 14 is provided on the electron injection preventive layer 13. An electrode 21 is provided on the transparent electrode 14. Since the electron injection preventive layer 13 is formed of a material satisfying the aforementioned inequalities (1), (2), and (3), dark current is suppressed, thereby increasing open current voltage.

Figure 8:
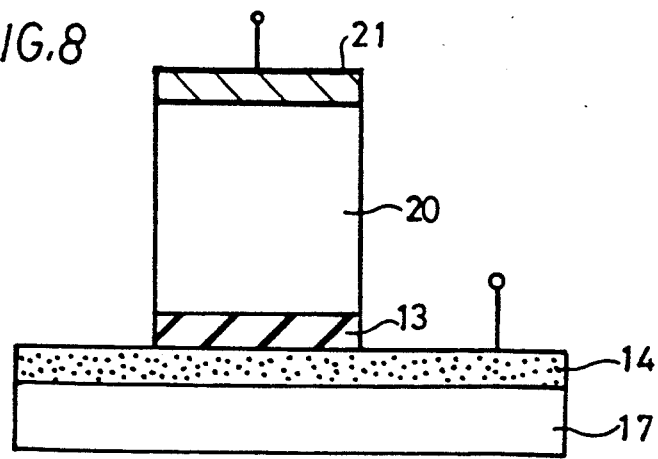
FIG. 8 is a cross sectional view showing an avalanche photodiode to which the invention is applied.
Figure 11:
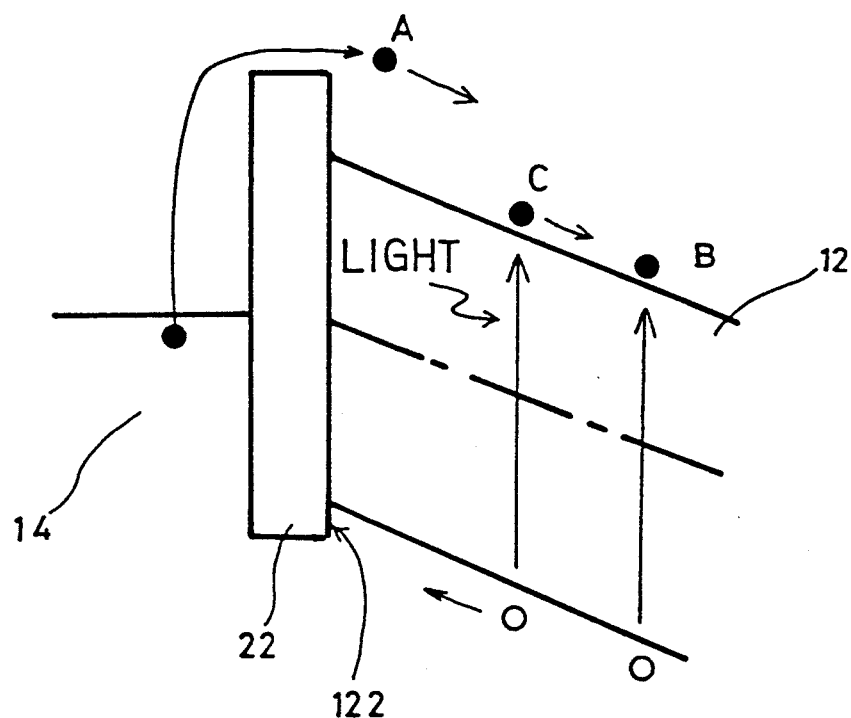
FIG. 11 is an energy band representation for use in illustration of problems associated with a conventional photoelectric converter.

FIG. 8 is a cross sectional view showing an avalanche photodiode to which the invention is applied. A transparent electrode 14 is provided on a transparent substrate 17. An electron injection preventive layer 13 formed of a material such as chrysene satisfying the aforementioned inequalities (1), (2), and (3) is provided on the transparent electrode 14. A photoelectric conversion layer 20 is provided on the electron injection preventive layer 13. An electrode 21 is provided on the photoelectric conversion layer 20. In the case of the avalanche photodiode, since high voltage is applied to the photoelectric conversion layer 20, it will be particularly important to reduce dark current. An avalanche photodiode with reduced dark current is provided by the use of the electric injection preventive layer 13 having the properties described above.

As in the foregoing, according to the invention, since the electron injection preventive layer for effectively preventing injection of electrons from the electrode to the photoelectric conversion film is inserted between the electrode and the photoelectric conversion film, a photoelectric converter with reduced dark current is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoelectric converter comprising:
    a substrate;
    a first electrode disposed on said substrate;
    a semiconductor layer disposed on said substrate covering said first electrode for photoelectric conversion;
    a second electrode disposed on said semiconductor layer; and
    an electron injection preventive layer inserted between said semiconductor layer and said second electrode for preventing electrons from being injected from said second electrode into said semiconductor layer wherein said electron injection preventive layer is formed of a material satisfying the following inequality:

$$\phi_M - x_2 \geq E_{g1}$$

where $\phi_M$ is the work function of said second electrode, $x_2$ is the electron affinity of said electron injection preventive layer, and $E_{g1}$ is the band gap energy of said semiconductor layer.

2. A converter as recited in claim 1 wherein said electron injection preventive layer is formed of a material further satisfying the following inequality:

$$x_2 \leq x_1$$

where $x_2$ is the electron affinity of said electron injection preventive layer and $x_1$ is the electron affinity of said semiconductor layer.

3. A converter as recited in claim 1 wherein said electron injection preventive layer is formed of a material further satisfying the following inequality:

$$x_2 + E_{g2} \leqq x_1 + E_{g1}$$

where $x_2$ is the electron affinity of said electron injection preventive layer, $E_{g2}$ is the band gap energy of said electron injection preventive layer, $x_1$ is the electron affinity of said semiconductor layer, and $E_{g1}$ is the band gap energy of said semiconductor layer.

4. A converter as recited in claim 2 wherein said electron injection preventive layer is formed of a material further satisfying the following inequality:

$$x_2 + E_{g2} \leqq x_1 + E_{g1}$$

where $E_{g2}$ is the band gap energy of said electron injection preventive layer and $E_{g1}$ is the band gap energy of said semiconductor layer.

5. A converter as recited in claim 1 wherein said electron injection preventive layer is formed of an organic compound containing a condensed polycyclic hydrocarbon in the molecular structure of the organic compound.

6. A converter as recited in claim 5 wherein said organic compound includes chrysene.

7. A converter as recited in claim 5, wherein said organic compound includes anthracene.

8. A converter as recited in claim 5, wherein said organic compound includes phenanthrene.

9. A converter as recited in claim 1 wherein said electron injection preventive layer is formed of a polymer compound having a condensed polycyclic hydrocarbon side chain.

10. A converter as recited in claim 1 wherein said photoelectric converter is part of a solid state image sensing apparatus.

11. A converter as recited in claim 1 wherein said photoelectric converter is part of an image sensing tube target.

12. A converter as recited in claim 1 wherein said photoelectric converter is part of a solar battery.

13. A converter as recited in claim 1 wherein said photoelectric converter is part of an avalanche photodiode.

14. A converter as recited in claim 1 wherein said semiconductor layer is an alloy containing amorphous silicon.

15. A converter as recited in claim 1 comprising a hole injection preventive layer disposed between said first electrode and said semiconductor layer covering said first electrode for preventing holes from being injected from said first electrode into said semiconductor layer.

* * * * *